US009797993B2

(12) United States Patent
Pauly et al.

(10) Patent No.: US 9,797,993 B2
(45) Date of Patent: Oct. 24, 2017

(54) ADVANCE MANUFACTURING MONITORING AND DIAGNOSTIC TOOL

(71) Applicants: Gerald W. Pauly, Houston, PA (US); Walter J. Keller, III, Bridgeville, PA (US)

(72) Inventors: Gerald W. Pauly, Houston, PA (US); Walter J. Keller, III, Bridgeville, PA (US)

(73) Assignee: Nokomis, Inc., Charleroi, PA (US)

( * ) Notice: Subject to any disclaimer, the term of this patent is extended or adjusted under 35 U.S.C. 154(b) by 572 days.

(21) Appl. No.: 14/141,653

(22) Filed: Dec. 27, 2013

(65) Prior Publication Data
US 2014/0218229 A1 Aug. 7, 2014

Related U.S. Application Data

(63) Continuation of application No. 12/551,635, filed on Sep. 1, 2009, now Pat. No. 8,643,539.
(Continued)

(51) Int. Cl.
G01S 7/41 (2006.01)
G01R 31/01 (2006.01)
G01R 31/26 (2014.01)
G01R 31/317 (2006.01)
G01R 29/08 (2006.01)
(Continued)

(52) U.S. Cl.
CPC ............ G01S 7/41 (2013.01); G01R 29/0871 (2013.01); G01R 31/01 (2013.01); G01R 31/26 (2013.01); G01R 31/31703 (2013.01); G01R 31/265 (2013.01); G01R 31/2642 (2013.01);
(Continued)

(58) Field of Classification Search
CPC ....... G01S 7/41; G01S 31/2894; G01R 17/00; G01R 29/08; G01R 29/0871; G01R 31/26; G01R 31/2642; G01R 31/265; G01R 31/2817; G01R 31/2851; G01R 31/2855; G01R 31/2849; G01R 31/302; G01R 31/3025; G01R 31/303–31/315; G01R 31/31703
USPC .......... 342/22, 165, 173, 175; 324/500, 501, 324/511, 512, 537, 754.01, 754.02,
(Continued)

(56) References Cited

U.S. PATENT DOCUMENTS 4,380,172 A * 4/1983 Imam .................... G01H 1/003
702/35
4,650,333 A * 3/1987 Crabb ................ G01B 11/2522
348/126
(Continued)

FOREIGN PATENT DOCUMENTS

JP 63085373 4/1988
JP H11174130 7/1999
JP 2004245709 9/2004

Primary Examiner — Peter M Bythrow
(74) Attorney, Agent, or Firm — James Ray and Assocs; Alexander Pokot

(57) ABSTRACT

A device and a method for monitoring and analysis utilize unintended electromagnetic emissions of electrically powered components, devices or systems. The emissions are received at the antenna and a receiver. A processor processes and measures change or changes in a signature of the unintended electromagnetic emissions. The measurement are analyzed to both record a baseline score for future measurements and to be used in determining status and/or health of the analyzed system or component.

57 Claims, 3 Drawing Sheets

Possible Utilization

Related U.S. Application Data

(60) Provisional application No. 61/199,650, filed on Nov. 19, 2008.

(51) Int. Cl.
  *G01R 31/28* (2006.01)
  *G01R 31/265* (2006.01)
  *G01R 31/302* (2006.01)

(52) U.S. Cl.
  CPC ...... *G01R 31/2851* (2013.01); *G01R 31/2894* (2013.01); *G01R 31/302* (2013.01)

(58) Field of Classification Search
  USPC ............ 324/754.31, 762.01, 762.02, 762.03, 324/763.01; 356/237.1
  See application file for complete search history.

(56) References Cited

U.S. PATENT DOCUMENTS

| | | | | |
|---|---|---|---|---|
| 5,142,224 A * | 8/1992 | Smith | .................. | G01R 31/308 324/754.23 |
| 5,218,294 A * | 6/1993 | Soiferman | ........... | G01R 31/315 324/763.01 |
| 5,300,879 A | 4/1994 | Masuda et al. | | |
| 5,302,830 A * | 4/1994 | Shivanandan | .......... | G01J 5/602 250/332 |
| 5,424,633 A * | 6/1995 | Soiferman | ......... | G01R 31/2812 324/538 |
| 5,517,110 A * | 5/1996 | Soiferman | ........... | G01R 31/315 324/538 |
| 5,563,702 A * | 10/1996 | Emery | ............. | G01N 21/95607 356/237.4 |
| 5,578,930 A * | 11/1996 | Sheen | .................. | G01R 31/046 324/529 |
| 5,714,888 A * | 2/1998 | Naujoks | ............... | G01R 31/308 324/501 |
| 5,754,450 A * | 5/1998 | Solomon | ............... | G01M 15/00 324/765.01 |
| 5,905,572 A * | 5/1999 | Li | ............................ | G03F 1/84 356/237.1 |
| 5,905,577 A * | 5/1999 | Wilsher | ............... | G01R 31/311 324/754.23 |
| 6,049,220 A * | 4/2000 | Borden | .............. | G01N 21/1717 257/E21.53 |
| 6,144,341 A | 11/2000 | Kraz | | |
| 6,236,223 B1 * | 5/2001 | Brady | ................ | G01R 31/2822 324/750.3 |
| 6,268,738 B1 | 7/2001 | Gunthorpe et al. | | |
| 6,375,347 B1 * | 4/2002 | Bruce | ................. | G01J 5/0003 324/754.23 |
| 6,417,797 B1 * | 7/2002 | Cousins | .................. | G06F 15/02 342/175 |
| 6,489,919 B1 * | 12/2002 | Brock | ................... | G01S 7/4008 342/165 |
| 6,667,711 B1 * | 12/2003 | Joshi | ..................... | G01S 7/4008 342/165 |
| 6,859,285 B1 * | 2/2005 | Chang | .................... | G01N 21/55 110/185 |
| 6,927,579 B2 | 8/2005 | Blades | | |
| 7,515,094 B2 | 4/2009 | Keller, III | | |
| 7,710,131 B1 * | 5/2010 | Tiernan | ............... | G01R 31/302 324/529 |
| 2002/0011852 A1 * | 1/2002 | Mandelis | ............. | G01R 31/311 324/750.02 |
| 2002/0039030 A1 * | 4/2002 | Khazei | ............... | G01R 29/0871 324/754.29 |
| 2002/0075017 A1 * | 6/2002 | Edwards | .............. | G01R 31/303 324/754.21 |
| 2003/0071262 A1 * | 4/2003 | Weiner | .................... | G01N 21/66 257/48 |
| 2003/0137318 A1 * | 7/2003 | Enachescu | ........... | G01R 31/308 324/760.01 |
| 2003/0206027 A1 * | 11/2003 | Nozoe | .................. | G01R 31/307 324/754.22 |
| 2004/0027149 A1 * | 2/2004 | Aitren | .................. | G01R 31/311 324/762.05 |
| 2005/0046430 A1 * | 3/2005 | Kinnunen | ............ | G01R 31/302 324/754.31 |
| 2006/0082488 A1 | 4/2006 | Keller, III | | |
| 2006/0103378 A1 * | 5/2006 | Pakdaman | ........... | G01R 31/311 324/228 |
| 2006/0152232 A1 * | 7/2006 | Shvets | ............... | G01R 31/2822 324/750.02 |
| 2006/0220858 A1 * | 10/2006 | Kawamata | ........... | G01R 31/311 340/572.1 |
| 2007/0027643 A1 * | 2/2007 | Lesesky | ............... | G01R 31/007 702/60 |
| 2007/0040118 A1 * | 2/2007 | Cheng | ................ | G01N 23/2251 250/310 |
| 2007/0120571 A1 * | 5/2007 | Huie | ..................... | G01R 31/002 324/512 |
| 2007/0213951 A1 * | 9/2007 | Van Eeden | ........ | G06K 7/10435 702/116 |
| 2007/0279071 A1 | 12/2007 | Orton | | |
| 2008/0048673 A1 * | 2/2008 | Tan | ..................... | G01R 1/06772 324/601 |
| 2008/0094273 A1 * | 4/2008 | Doyen | ............... | G01R 31/3025 342/22 |
| 2008/0141072 A1 * | 6/2008 | Kalgren | ................ | G01D 3/08 714/33 |
| 2008/0177486 A1 * | 7/2008 | Farkas | ................ | G01R 31/304 702/59 |
| 2009/0002000 A1 * | 1/2009 | Nikawa | ................ | G01R 31/315 324/750.23 |
| 2009/0306920 A1 * | 12/2009 | Zwinger | ............ | G01R 31/2884 702/77 |
| 2010/0073665 A1 * | 3/2010 | Zhao | ...................... | G01N 25/72 356/36 |
| 2010/0125438 A1 * | 5/2010 | Audet | ............... | G01R 29/0857 702/189 |
| 2011/0068818 A1 * | 3/2011 | Fukami | ............. | G01R 31/2642 324/762.01 |

* cited by examiner

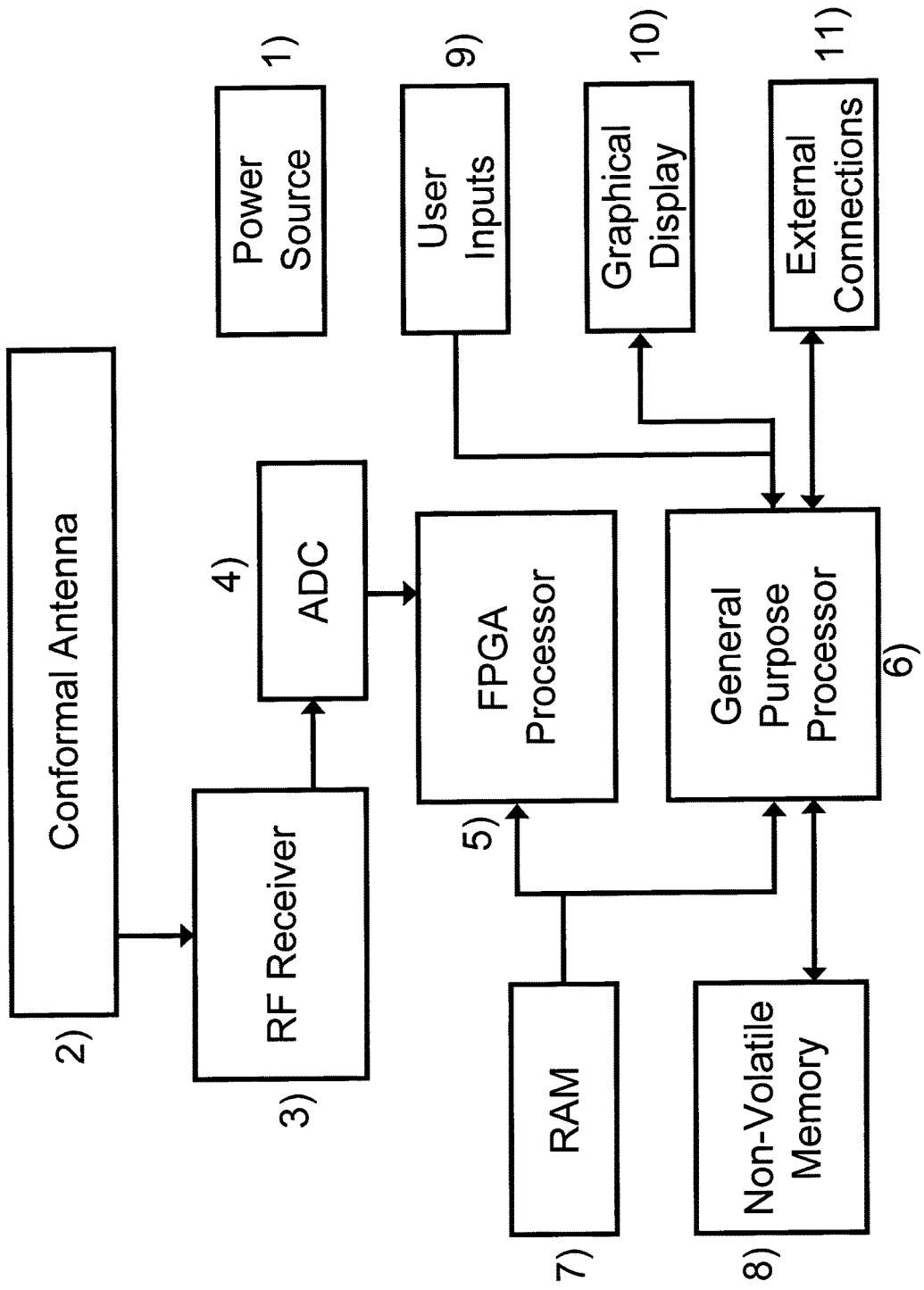
Figure 1: Possible Implementation

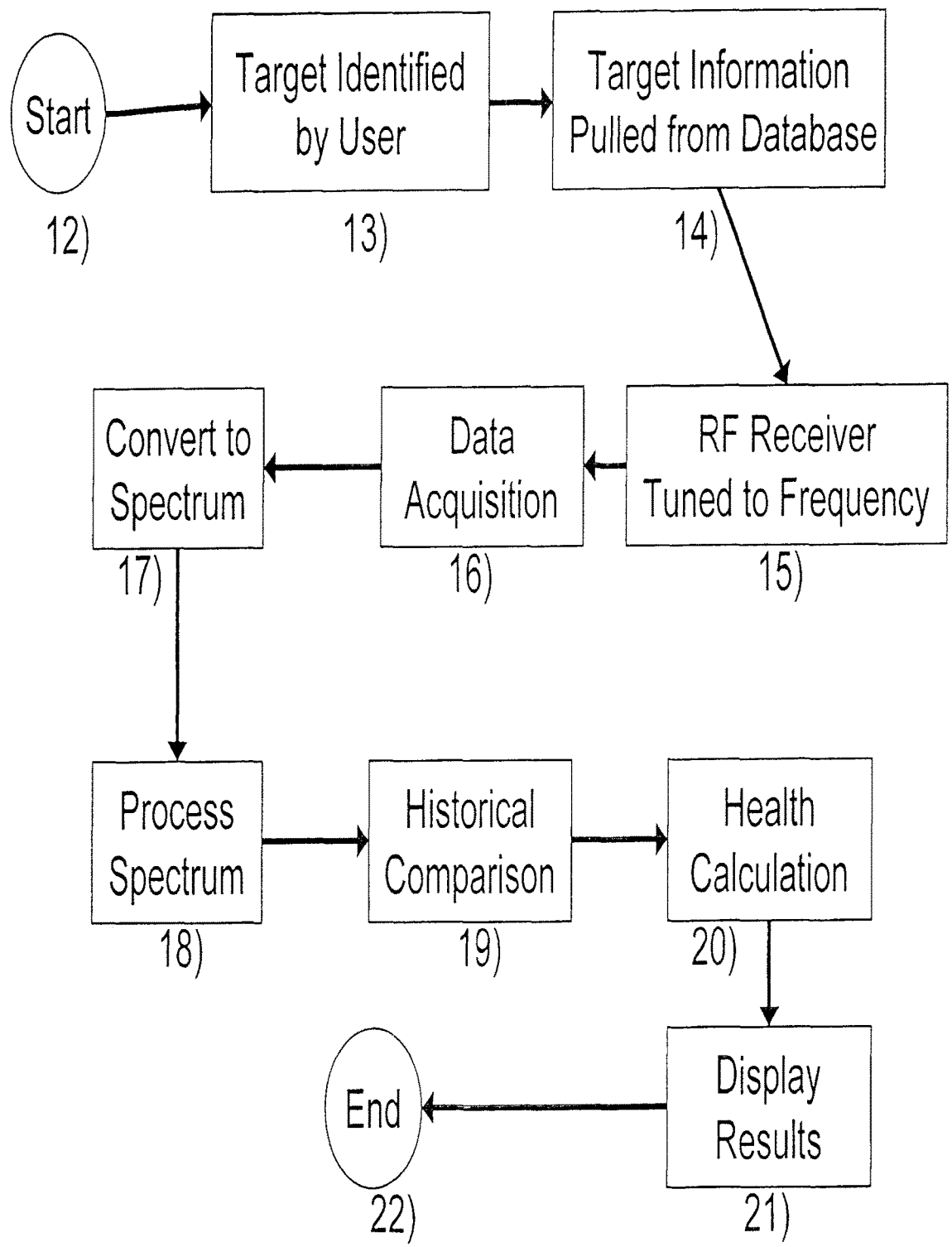
Figure 2: Processing Flow Chart

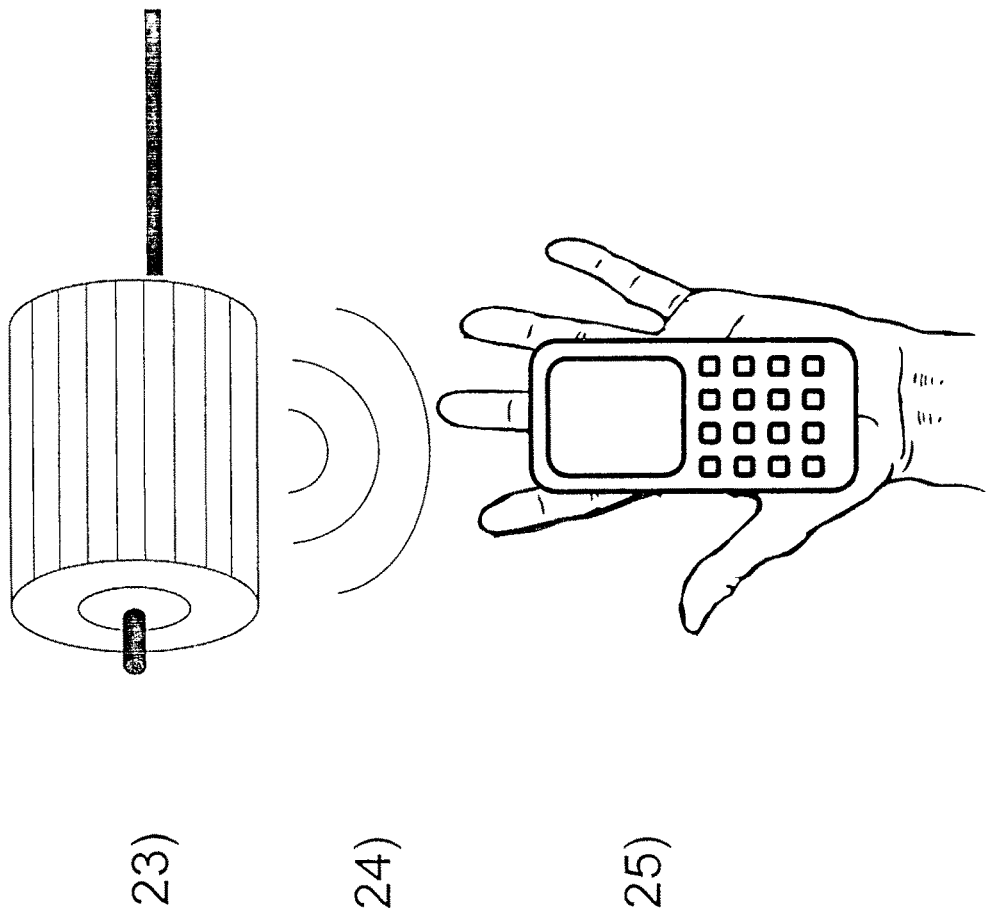
Figure 3: Possible Utilization

ADVANCE MANUFACTURING MONITORING AND DIAGNOSTIC TOOL

CROSS REFERENCE TO RELATED APPLICATION

This patent application is a Continuation of U.S. patent application Ser. No. 12/551,635 filed Sep. 1, 2009. This patent application is related to and claims priority from U.S. Provisional Patent Application Ser. No. 61/199,650 filed Nov. 19, 2008 and is herein incorporated by reference.

FIELD OF THE INVENTION

The present invention relates, in general, to the monitoring and diagnosis of electrical devices by measuring electromagnetic emissions and, more particularly, this invention relates to a monitoring and analysis device and a method for monitoring and analysis that utilizes the unintended electromagnetic emissions of electrically powered systems.

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND OF THE INVENTION

Many of the concepts of the present invention are outlined in U.S. Pat. No. 7,515,094 and U.S. patent application Ser. No. 12/422,646 and are herein incorporated by reference.

The current invention relates to the field of electromagnetic emissions of electrically powered systems. Specifically it relates to systems or components of systems that require electrical power to operate. The function of these systems or components can be motive, thermal generation, or processing and control modules. All of these systems make use of electricity and exhibit wear that degrades their performance over time and can lead to system or component failure.

SUMMARY OF THE INVENTION

The present invention is a monitoring and analysis device that utilizes the unintended emissions of electrically powered systems. The certain embodiments of the invention can be completely automated and non-invasive to the device being analyzed.

The present invention monitors electrical devices by taking detailed measurements of the electromagnetic fields emitted by any component or system utilizing electricity. The measurements will be analyzed to both record a baseline score for future measurements and to be used in detailed analysis to determine the status of the analyzed system or component.

The use of electrical energy generates electromagnetic fields in accordance with many known electrical and electromagnetic physical laws. Detailed measurements can detect specific emitted differences between similar components and discern component status and degradation. Generated field characteristics can also be changed by the operational mode and characteristics of an electrical device being measured.

Utilizing an antenna, a radio-frequency tuner, and integrated processing components the spectrum of the target device is monitored and analyzed to diagnose problems and potential failure of the target device.

In more detail, an advantage of the present invention is the ability to monitor and diagnose electrical equipment without any alterations or physical connections to the device being monitored. The present invention allows for the automated and remote monitoring of any electrically powered device.

The advantages of the present inventions include, without limitation, the ability to monitor and analyze electronics without the need to disassemble the target, to physically attach monitoring equipment, or to employ specially designed equipment throughout a factory or other manufacturing environment. The device outlined in this would be easier to employ than current methods while providing a greater breadth of information.

Electrical components and systems are found in numerous implementations throughout every industry. Current methods of maintenance and repair for these devices involve laborious testing using physical access to the device of interest. Such access is not in the best interest of the users of these systems and components.

Systems must be shut down to safely access high power components but certain problems may not manifest in a powered down state. In addition, the time required to inspect said devices and to keep the system disabled for inspection is highly costly.

The present invention provides a method of monitoring and diagnosing problems with complex electrical systems without the need to interfere with the operation of these systems or components. Operations can continue, saving money and time that would be diverted to maintenance. In addition, the present invention will provide greater data than previously possessed allowing system failures to be prevented, saving additional time and money.

In more detail, the present invention is capable of detecting and analyzing the unintended electromagnetic signature produced by any device employing electricity for power. The electromagnetic emissions of an electrically powered device vary depending on the health and status of the internal components of the device being monitored. The device outlined in this patent utilizes these unintended electromagnetic emissions to determine the health of a specific electrical device.

OBJECTS OF THE INVENTION

It is, therefore, one of the primary objects of the present invention to provide a system to diagnose and monitor electrically powered systems and components by measuring the unintended radiated electromagnetic characteristics emitted from said electrically powered systems and components.

It is another object of the present invention to provide a diagnostic tool to assess the health of electrically powered support operations and equipment in a manufacturing environment.

It is another object of the present invention to provide a diagnostic tool to assess the health of electrically powered support operations and equipment in a non-manufacturing environment.

It is another object of the present invention to provide a diagnostic tool to assess the performance of products of a manufacturing line.

It is another object of the present invention to provide a quality assurance tool during the manufacturing process.

It is another object of the present invention to provide a diagnostic tool to assess the health of electrically powered manufacturing equipment and tools.

It is another object of the present invention to provide a diagnostic tool to assess the health of electrically powered manufacturing processes.

It is another object of the present invention to provide a means to significantly decrease the costs associated with manufacturing processes.

It is another object of the present invention to provide a means to significantly decrease the costs associated with manufacturing maintenance processes.

It is another object of the present invention to provide an improved troubleshooting capability for manufacturing processes.

It is another object of the present invention to provide a diagnostic tool to assess the health of electrically powered manufacturing equipment.

It is another object of the present invention to significantly decrease costs associated with manufacturing equipment.

It is another object of the present invention to significantly decrease costs associated with manufacturing maintenance equipment.

It is another object of the present invention to provide trouble shooting capability for manufacturing equipment.

It is another object of the present invention to provide a preventative maintenance capability to limit unanticipated down time.

It is another object of the present invention to allow measurements to be taken without any modifications of the targeted equipment.

It is another object of the present invention to provide a mobile and readily reconfigurable diagnostic tool for a variety of equipment diagnostic tasks.

It is another object of the present invention to provide a diagnostic tool that allows operation by a user without any advanced training or education in the theory of electromagnetism to be effective.

It is another object of the present invention to provide either narrow band or wide band spectrum analysis of the equipment undergoing analysis.

It is another object of the present invention to provide a diagnostic tool that can be used to determine equipment that needs periodic maintenance whether the anticipated lifespan of the equipment has elapsed or not.

It is another object of the present invention to provide a diagnostic tool that can be used to determine if equipment can remain in service beyond the anticipated lifespan due to the continued good health of the device.

It is another object of the present invention to provide a diagnostic tool that it be used to diagnose manufacturing inconsistencies on a board level.

It is another object of the present invention to provide a diagnostic tool that can be used for quality control during semiconductor manufacturing.

It is another object of the present invention to provide a diagnostic tool that it is comprised of additional processing assets to enhance diagnosis of manufacturing processes.

It is another object of the present invention to provide a diagnostic tool that uses conformal antenna technology to enhance diagnostics of manufacturing processes.

It is another object of the present invention to provide a diagnostic tool that uses advanced software tools to enhance diagnostics of manufacturing processes.

It is another object of the present invention to provide a diagnostic tool that uses a sensitive radio frequency receiver that functions in the microwave frequency band for diagnostics of manufacturing processes using free field emissions from the equipment being tested.

It is another object of the present invention to provide a diagnostic tool that is comprised of a sensitive receiver that functions in the electromagnetic frequency bands below 1 MHz for the diagnosis of manufacturing processes using free field emissions from the equipment being tested.

It is another object of the present invention to provide a diagnostic tool that is comprised of a sensitive receiver that functions in the electromagnetic frequency bands above 1 MHz for the diagnosis of manufacturing processes using free field emissions from the equipment being tested.

It is another object of the present invention to provide a diagnostic tool enhanced by the inclusion of ultra sensitive front end receivers.

It is another object of the present invention to provide a diagnostic tool enhanced by the inclusion of Field Programmable Gate Array (FPGA) based processing assets.

It is another object of the present invention to provide a diagnostic tool enhanced by the inclusion of a detailed manufacturing equipment emissions signature database.

It is another object of the present invention to provide a diagnostic tool enhanced by the inclusion of robust signature detection software.

It is another object of the present invention to provide a diagnostic tool enhanced by the use of external computational assets.

It is another object of the present invention to provide a diagnostic tool enhanced by a direct connection to the targeted electronic equipment.

It is another object of the present invention to provide a diagnostic tool enhanced by the inclusion of thermal data of the targeted electronic equipment.

It is another object of the present invention to provide a diagnostic tool enhanced by the inclusion of visual data of the targeted electronic equipment.

It is another object of the present invention to provide a diagnostic tool enhanced by the inclusion of an active electromagnetic illumination of the targeted electronic equipment.

It is another object of the present invention to provide a diagnostic tool enhanced by the inclusion of X-Ray data of the targeted electronic equipment.

It is another object of the present invention to provide a diagnostic tool enhanced by the inclusion of physical dimension data of the targeted electronic equipment.

It is another object of the present invention to provide a diagnostic tool enhanced by the inclusion of sonic data of the targeted electronic equipment.

It is another object of the present invention to provide a method for the monitoring and analysis of the health of electrical motors.

It is another object of the present invention to provide a method for the monitoring and analysis of the health of electrical controls.

It is another object of the present invention to provide a method for the monitoring and analysis of the health of implanted medical devices.

It is another object of the present invention to provide a method for the monitoring and analysis of the health of robotic technologies.

It is another object of the present invention to provide a method for the monitoring and analysis of the health of electronic sensors.

It is another object of the present invention to provide a method for the monitoring and analysis of the health of Radio Frequency Identification (RFID) devices.

It is another object of the present invention to provide a method for the monitoring and analysis of the health of radios and other electromagnetic communication devices.

It is another object of the present invention to provide a method for the monitoring and analysis of the health of automotive electrical systems.

It is another object of the present invention to provide a method for the monitoring and analysis of the health of aerospace electrical systems during normal operations of the aerospace vehicle.

It is another object of the present invention to provide a method for the monitoring and analysis of the health of any ground based electrical systems that employ electronics.

It is another object of the present invention to provide a method for the monitoring and analysis of the health of battery chargers.

It is another object of the present invention to provide a method for the monitoring and analysis of the health of electrical ignition systems.

It is another object of the present invention to provide a method for the monitoring and analysis of the health of electrical servo-motors.

It is another object of the present invention to provide a method for the monitoring and analysis of the health of electrical solenoids and valves.

It is another object of the present invention to provide a method for the monitoring and analysis of the health of generators and alternators.

It is another object of the present invention to provide a method for the monitoring and analysis of the health of transformers and electrical switching systems.

It is another object of the present invention to provide a method for the monitoring and analysis of the health of computers and other processing equipment.

It is another object of the present invention to provide a method for the monitoring and analysis of the health of microcontrollers.

It is another object of the present invention to provide a method for the monitoring and analysis of the health of microprocessors.

It is another object of the present invention to provide a method for the monitoring and analysis of the health of electrical monitoring and diagnosis devices.

In one embodiment, the invention is an electromagnetic emission measurement device comprising: an antenna, a receiver, at least one processor, wherein said electromagnetic emission measurement device is configured to monitor at least one electrical device by measuring at least one electromagnetic emission given off by said at least one electrical device. In another embodiment the electromagnetic emission measurement device comprises an analog to digital converter. In another embodiment the electromagnetic emission measurement device comprises of an integrated receiver and processor. In another embodiment the electromagnetic emission measurement device further comprises of an active illumination transmitter. In yet another embodiment the electromagnetic emission measurement device is configured to monitor the health of said electrical device. In still another embodiment the electromagnetic emission measurement device is configured to diagnose defects in said electrical device. In yet still another embodiment the electromagnetic emission measurement device is used to predict the degradation a component of said electrical device. In still yet another embodiment the electromagnetic emission measurement device is used to predict the degradation of said electrical device. In yet another embodiment the electromagnetic emission measurement device operates in real time to assess the health of said electrical device. In still another embodiment the electromagnetic emission measurement device is used in stand-alone measurements to assess in real-time said electrical device's health. In yet another embodiment the electromagnetic emission measurement device is configured to assess the health of an electronic system. In still another embodiment the electromagnetic emission measurement device is configured to focus on a specified component and subcomponent. In another embodiment the electromagnetic emission measurement device is configured to measure said at least one electromagnetic emission for an extended period of time in at least two periodic measurements. In another embodiment the electromagnetic emission measurement device is configured to assess changes in an electromagnetic signature over time. In yet another embodiment the electromagnetic emission measurement device is a diagnostic tool, wherein the receiver is configured to monitor frequency bands above microwave frequencies. In still another embodiment the electromagnetic emission measurement device is configured to measure, analyze and identify signature characteristics of said at least one electrical device for measurement, analysis and diagnosis of a condition of said at least one electrical device. In yet still another embodiment said at least one electrical device comprises an electric motor. In still another embodiment said at least one electrical device comprises a transformer. In another embodiment said at least one electrical device comprises a solenoid. In yet another embodiment said at least one electrical device comprises an engine ignition mechanism. In another embodiment said at least one electrical device comprises a propane powered device. In still another embodiment said at least one electrical device comprises a gasoline powered device. In still another embodiment said at least one electrical device comprises a transistor based device. In yet another embodiment said at least one electrical device comprises a microprocessor. In yet another embodiment said at least one electrical device comprises a microcontroller. In still another embodiment said at least one electrical device comprises a sensor. In yet another embodiment said at least one electrical device comprises a device that transmits electromagnetic energy. In another embodiment said at least one electrical device comprises a device that receives electromagnetic energy. In yet another embodiment said at least one electrical device provides electronic controls. In another embodiment said at least one electrical device comprises an electronic control mechanism for automated manufacturing activities. In still another embodiment said electromagnetic emission measurement device is used to monitor an RFID system. In yet still another embodiment said at least one electrical device comprises functions in an RFID system. In yet another embodiment the electromagnetic emission measurement device is configured to provide intermittent health monitoring of manufacturing equipment to facilitate efficient maintenance. In still another embodiment the electromagnetic emission measurement device is configured to provide continuous health monitoring of manufacturing equipment to facilitate efficient maintenance. In yet another embodiment the electromagnetic emission measurement device is mobile and monitors electrical or electronic manufacturing equipment. In still another embodiment the electromagnetic emission measurement device is configured as a permanently fixed device to monitor specific electrical or electronic manufacturing equipment. In yet another embodiment the electromagnetic emission measurement device is used for quality control related to products developed in a manufacturing facility. In another embodiment the electromagnetic emission measurement device is used for quality control of materials to be incorporated into a manufactured product. In still another embodiment the electromagnetic emission measurement device is used to assure that all subcomponents and subassemblies for construction into a manufactured product are correctly identified. In yet another embodiment the electromagnetic emission measurement device is used to assure that all subcomponents and subassemblies constructed into a manufactured product are correctly assembled. In another embodiment the electromagnetic emission measurement device is used for quality control to identify improperly constructed products.

In another embodiment the invention is a method for monitoring at least one electrical component, said method comprising the steps of: providing a receiver for measuring a electromagnetic emissions signature; providing a database of electromagnetic emission signatures; and comparing said electromagnetic emission signature to said database of electromagnetic emission signatures to determine a status for said at least one predetermined electrical component.

In addition to the various objects and advantages of the present invention described with some degree of specificity above it should be obvious that additional objects and advantages of the present invention will become more readily apparent to those persons who are skilled in the relevant art from the following more detailed description of the invention, particularly, when such description is taken in conjunction with the attached drawing figures and with the appended claims.

BRIEF DESCRIPTION OF THE DRAWINGS

FIG. 1 is a diagram of an example embodiment of the components utilized in the present invention.

FIG. 2 is a diagram of an example embodiment of the functionality of the present invention.

FIG. 3 is a diagram of an example embodiment of the invention is use.

BRIEF DESCRIPTION OF A PRESENTLY PREFERRED AND VARIOUS ALTERNATIVE EMBODIMENTS OF THE INVENTION

Prior to proceeding to the more detailed description of the present invention it should be noted that, for the sake of clarity and understanding, identical components which have identical functions have been identified with identical reference numerals throughout the several views illustrated in the drawing figures.

Reference is now made, more particularly, to FIG. 1 of the drawings which provides a diagram of the components that could be utilized in the present invention. Power source 1 provides sufficient electrical power for all components. Power source 1 could be an external power supply, but preferably is an internal battery. Conformal antenna 2 is tuned to the appropriate frequencies and should be designed to fit within the confines of the device. RF receiver 3 receives a raw signal from conformal antenna 2, extracts the desired target frequency or frequencies, and retransmits the target signal at a reference frequency. Analog-to-digital converter (ADC) 4 converts the signal or signals from analog to digital format for use by the Field Programmable Gate Array (FPGA) 5.

FPGA 5 is a semiconductor device that can be configured to perform the actions and functions of an application-specific integrated circuit (ASIC) or the like. FPGA 5 will conduct initial processing of the targeted analog signal, including converting it to a baseband frequency. Such conversion to a baseband frequency could be accomplished by using a cascade integrated comb (CIC) filter to decimate the data, and apply a Fast Fourier Transform (FFT) to transition to the signal to a frequency domain. Other methods cold be employed instead or in addition to CIC and FFT, which could include wavelet transforms, or other similar methods known in the art. General purpose processor (GPU)6 could perform higher level processing on the signal including comparing the signal to the predetermined signature, accessing non-volatile memory to store historical records, and interface with a user. Random access memory (RAM) 7 could be used by both GPU 6 and FPGA 5 for short term data storage. Non-volatile memory 8 could consist of a long term stable memory that will store details and measurement between power off states of the device. User inputs 9 could consist of several buttons on the device that will allow the user to select the target to be measured and the type of measurement to conduct. Graphical display 10 could show the user the status of the device and the results of any test conducted. The user inputs 9 and graphical display 10 could be incorporated together to form a graphical user interface, which could be in the form of a touch screen interface. External connections 11 could consist of any means to allow the data of the device to be downloaded to an outside computer for both reports and further analysis.

Reference is now made to FIG. 2 which is a diagram of an example embodiment of the functionality of the present invention. At Start 12 a new target electronic device will be detected by the present invention. At target identified by user 13, a user identifies the desired target to the Advanced Manufacturing Monitoring and Diagnosis Tool embodying the present invention, either selecting one from memory that has been inspected before or by selecting a new target. This step may include identifying the type of device being monitored. At target information pulled from database 14, Information about past measurements of the electrically powered target and about the anticipated reading is recovered from non-volatile memory 8. at RF receiver tuned to frequency 15, the system is prepared by setting the RF Receiver for the appropriate frequencies for the specified target. At data acquisition 16, the RF Receiver 3, ADC 4, and FPGA 5 acquire data from the Conformal Antenna 2, producing a digital waveform of the emitted spectrum from the targeted component, device or system. At convert spectrum 17, FPGA 5 performs initial processing of the signature by performing a CIC filter and an FFT to transform the waveform to the frequency domain of interest. At process spectrum 18, the FPGA 5 and the GPU 6 process the frequency domain to identify inconsistencies in the measured waveform from the anticipated waveform. At historical comparison 19, the GPU 6 compares the measurements to historical measurements of the target device to identify any trends towards the deterioration or failure of the targeted device. At health calculation 20, the GPU 6 could then weight the results of the processes to give a total health assessment of the targeted device. At display results 21, the health assessment and any associated data requested are provided to the user by means of the graphical display, logging into a file, or the like. At end 22, the process of monitoring and diagnosing this target is completed and the invention could be reset to start 12.

Reference is now made to FIG. 3 a diagram of an example embodiment of the present invention is use. Electrical device 23 emits EM radiation 24 which is detected and measured by Advance Manufacturing Monitoring and Diagnostic Tool 25 shown as a hand held device. In practice Advance Manufacturing Monitoring and Diagnostic Tool 25 would be carried by a user in a manufacturing facility or other environment where such monitoring would be beneficial, so that user could quickly inspect the health of various electrical components, devices and systems.

While a presently preferred and various alternative embodiments of the present invention have been described in sufficient detail above to enable a person skilled in the relevant art to make and use the same it should be obvious that various other adaptations and modifications can be envisioned by those persons skilled in such art without departing from either the spirit of the invention or the scope of the appended claims.

We claim:

1. A device comprising:
   an antenna,
   a receiver configured, in combination with said antenna, to receive at least one emission of an electromagnetic energy, said at least one electromagnetic emission being given off by at least one electrical device,
   at least one processor, and
   wherein said device is configured to passively measure and process a change or changes in a signature of the at least one electromagnetic emission.

2. The device of claim 1, wherein said device is configured to monitor said at least one electrical device by measuring and processing more than one electromagnetic emission given off by the at least one electrical device.

3. The device of claim 1, wherein said device comprises an analog to digital converter.

4. The device of claim 1, wherein said device is configured to monitor a health of at least one of the at least one electrical device and an electronic system.

5. The device of claim 1, wherein said device is configured to diagnose defects in the at least one electrical device.

6. The device of claim 1, wherein said device is configured to predict a degradation of at least one of the at least one electrical device and a component thereof.

7. The device of claim 1, wherein said device is configured to assess a health of the at least one electrical device in a real time manner.

8. The electromagnetic emission measurement device of claim 1, wherein said device is used in stand-alone measurements to assess a health of the at least one electrical device in a real-time manner.

9. The device of claim 1, wherein said device is configured to focus on a specified component and subcomponent.

10. The device of claim 1, wherein aid device is configured to measure the at least one electromagnetic emission for an extended period of time in at least two periodic measurements.

11. The device of claim 1, wherein said device is configured to assess changes in said signature over time.

12. The device of claim 1, wherein said device is a diagnostic tool and wherein said receiver is configured to monitor frequency bands above microwave frequencies.

13. The device of claim 1, wherein said device is further configured to analyze and identify signature characteristics of the at least one electrical device for measurement, analysis and diagnosis of a condition of the at least one electrical device.

14. The device of claim 1, wherein said device is configured to monitor an RFID system.

15. The device of claim 1, wherein said device is configured to monitoring and analyze of health of a ground based electrical systems that employ electronic components.

16. The device of claim 1, wherein said device is configured to provide intermittent or continuous health monitoring of a manufacturing or non-manufacturing equipment so as to facilitate efficient maintenance thereof.

17. The device of claim 1, wherein said device is a mobile device configured to monitor electrical or electronic manufacturing equipment.

18. The device of claim 1, wherein said device is configured as a permanently fixed device to monitor electrical or electronic manufacturing equipment.

19. The device of claim 1, wherein said device is used for quality control related to products developed in a manufacturing facility.

20. The device of claim 1, wherein said device is configured to quality control materials to be incorporated into a manufactured product.

21. The device of claim 1, wherein said device is configured to assure that all subcomponents and subassemblies for construction into a manufactured product are correctly identified or assembled.

22. The device of claim 1, wherein said device is configured to identify improperly constructed products.

23. The device of claim 1, wherein said device is configured to assure that quality of each subcomponent and subassembly for construction into a manufactured product meets a predetermined quality standard.

24. The device of claim 1, wherein said device is configured to diagnose inconsistencies in a semiconductor.

25. The device of claim 24, wherein said device is configured to diagnose said inconsistencies in said semiconductor integrated within at least one of a microcontroller and a microprocessor.

26. The device of claim 24, wherein said device is configured to diagnose said inconsistencies in said semiconductor installed within at least one circuit board.

27. The device of claim 24, wherein said device is configured to diagnose said inconsistencies during a manufacturing process.

28. The device of claim 24, wherein said device is configured to diagnose said inconsistencies during manufacturing of a semiconductor.

29. The device of claim 1, wherein the at least one electrical device is at least two semiconductors and wherein said device is configured to diagnose inconsistencies between individual semiconductors.

30. The device of claim 29, wherein said device is configured to diagnose said inconsistencies between the at least two semiconductors integrated within at least one of a microcontroller and a microprocessor.

31. The device of claim 29, wherein said device is configured to diagnose said inconsistencies between the at least two semiconductors that form integrated circuits.

32. The device of claim 29, wherein said device is configured to diagnose said inconsistencies between individual semiconductors for a quality control of components to be installed on a manufacturing line within at least one circuit board.

33. The device of claim 1, further comprising a housing sized to be held by a hand of a user, wherein said antenna and said receiver are disposed within said housing.

34. The device of claim 1, wherein said at least one electrical device comprises at least one semiconductor device, wherein said at least one electromagnetic emission comprises an unintended electromagnetic emission and wherein said device is configured to assess at least one of a health, defect, inconsistency and degradation of the at least one semiconductor device either during manufacturing of the at least one semiconductor device, during manufacturing of an assembly containing the at least one semiconductor device or during a quality control inspection.

35. The device of claim 1, wherein said device is configured to monitor a level of a degradation of the at least one electrical device.

36. The device of claim 1, wherein said at least one processor comprises a Field Programmable Gate Array (FPGA) processor configured to conduct an initial processing of a targeted analog signal and wherein said at least one processor further comprises a general purpose processor (GPU) coupled to said FPGA processor and configured to perform higher level processing of said analog signal, said higher level processing including at least one of comparing said signal to a predetermined signature, accessing a non-volatile memory provided within said device so as to store historical records, and interfacing with a user of said device.

37. The device of claim 36, wherein said FPGA processor is further configured to transform a digital waveform of the emitted spectrum from the at least one electrical device to a frequency domain of interest.

38. The device of claim 37, further comprising a cascade integrated comb (CIC) filter configured to decimate a frequency signal, and wherein said FPGA processor is further configured to apply Fast Fourier Transform (FFT) to said frequency signal.

39. The device of claim 37, wherein said FPGA and GPU are configured to process said frequency domain and are further configured to identify inconsistencies in said digital waveform from an anticipated waveform.

40. The device of claim 1, wherein said at least one processor is configured to extract a desired target frequency from a raw signal received from said antenna.

41. The device of claim 1, wherein said at least one processor is configured to transform a digital waveform of the emitted spectrum from the at least one electrical device to a frequency domain of interest.

42. The device of claim 1, wherein said at least one processor is configured to determine a status of the at least one electrical device.

43. The device of claim 1, wherein the at least one electrical device comprises at least one of an electric motor, an electric generator, an electrical oscillator, a digital processing component, an electrical relay, a transformer, a solenoid, an engine ignition mechanism, a propane powered device, a gasoline powered device, a transistor based device, a semiconductor, a microprocessor, a microcontroller, a sensor, a device that transmits electromagnetic energy, an electronic control mechanism for automated manufacturing activities, functions in an RFID system, an aerospace vehicle, an aerospace system, a ground vehicle, and a ground based system.

44. A method comprising the steps of:
(a) providing a device comprising an antenna, a receiver and at least one processor, said receiver configured, in combination with said antenna, to receive at least one emission of an electromagnetic energy, said at least one emission being given off by at least one electrical device, said device being configured to passively measure and process a change or changes in a signature of the at least one electromagnetic emission;
(b) passively receiving, with said device, said at least one emission; and
(c) measuring and processing said change or changes in a signature of said at least one electromagnetic emission, received in step (b).

45. The method of claim 44, further comprising the additional step of identifying, by a user, a target within said at least one electrical device that is to be monitored and the additional step of setting said receiver for appropriate frequencies for said target.

46. The method of claim 44, further comprising additional steps of weighting the results of comparing a measurement of said signature to a predefined measurement and assessing said status of the at least one electrical device.

47. The method of claim 44, further comprising the additional step of identifying inconsistencies in a measurement of said signature from a predefined measurement and assessing said status of the at least one electrical device.

48. The method of claim 44, wherein said at least one processor includes a Field Programmable Gate Array based processor configured to conduct initial processing of a targeted analog signal, including converting said targeted analog signal to a baseband frequency and a general purpose processor coupled to said Field Programmable Gate Array based processor and configured to perform higher level processing of said analog signal including at least one of comparing said signal to a predetermined signature, accessing a non-volatile memory provided within said electromagnetic emission measurement device so as to store historical records, and interfacing with a user.

49. The method of claim 44, further comprising the additional step of providing a database of measurements of electromagnetic emission signatures and comparing a measurement of said change or changes in said signature of said at least one electromagnetic emission to said database of said measurements of said electromagnetic emission signatures.

50. The method of claim 49, further comprising the step of determining a status of said at least one electrical device.

51. The method of claim 49, further comprising the step of determining a degradation level for said at least one electrical component without an aid from a hardwire connection to said at least one electrical device.

52. The method of claim 44, further comprising the additional steps of carrying, by a user, said device within a facility or environment and the step of at least one of monitoring, diagnosing and inspecting, with said device, based on said change or changes in said signature, at least one of a status and a health of said at least one electrical device being present in said facility or environment.

53. The method of claim 44, further comprising the additional steps of positioning said device remotely from said at least one electrical device and at least one of monitoring, diagnosing and inspecting, with said device, based on said change or changes in said signature, at least one of a status and a health of said at least one electrical device.

54. A device comprising:
an antenna;
a receiver configured, in combination with said antenna, to receive at least one emission of an electromagnetic energy, the at least one electromagnetic emission being given off by at least one of electric motor, an electric generator, an electrical oscillator, an electrical relay, a transformer, a solenoid, an engine ignition mechanism, a propane powered device, a gasoline powered device, a microcontroller, a sensor, an electronic control mechanism for automated manufacturing activities, an aerospace vehicle, an aerospace system, a ground vehicle, and a ground based system;

at least one processor; and said device is configured to measure and process a change or changes in a signature of the at least one electromagnetic emission.

55. The device of claim 54, wherein said device further comprises an active illumination transmitter.

56. The device of claim 54, wherein said receiver is a radio frequency (RF) receiver configured to extract a desired target frequency from a raw signal received from said antenna.

57. The device of claim 56, wherein said at least one processor includes a Field Programmable Gate Array (FPGA) configured to convert said target frequency to a baseband frequency.

\* \* \* \* \*